US007003746B2

(12) United States Patent
Hyduke et al.

(10) Patent No.: US 7,003,746 B2
(45) Date of Patent: Feb. 21, 2006

(54) METHOD AND APPARATUS FOR ACCELERATING THE VERIFICATION OF APPLICATION SPECIFIC INTEGRATED CIRCUIT DESIGNS

(76) Inventors: Stanley M. Hyduke, 59 Gulf Stream Ct., Las Vegas, NV (US) 89113; Slawomir Grabowski, Lakta Gorna 248, 32-731 Zegocina (PL)

( * ) Notice: Subject to any disclaimer, the term of this patent is extended or adjusted under 35 U.S.C. 154(b) by 283 days.

(21) Appl. No.: 10/686,022

(22) Filed: Oct. 14, 2003

(65) Prior Publication Data

US 2005/0081170 A1 Apr. 14, 2005

(51) Int. Cl.
G06F 17/50 (2006.01)
G06F 9/45 (2006.01)
G06F 7/62 (2006.01)
G06F 9/455 (2006.01)

(52) U.S. Cl. .................. 716/4; 716/2; 716/5; 716/6; 703/13; 703/23

(58) Field of Classification Search .................. None
See application file for complete search history.

(56) References Cited

U.S. PATENT DOCUMENTS

| | | | | |
|---|---|---|---|---|
| 5,475,830 A * | 12/1995 | Chen et al. | .......... | 716/16 |
| 5,579,510 A * | 11/1996 | Wang et al. | .......... | 716/6 |
| 6,009,256 A * | 12/1999 | Tseng et al. | .......... | 703/13 |
| 6,009,531 A * | 12/1999 | Selvidge et al. | .......... | 713/400 |
| 6,301,553 B1 * | 10/2001 | Burgun et al. | .......... | 703/15 |
| 6,389,379 B1 * | 5/2002 | Lin et al. | .......... | 703/14 |
| 2003/0105617 A1 * | 6/2003 | Cadambi et al. | .......... | 703/14 |

* cited by examiner

Primary Examiner—Leigh M. Garbowski
(74) Attorney, Agent, or Firm—Trojan Law Offices

(57) ABSTRACT

A method and system for accelerating software simulator operation with the aid of reprogrammable hardware such as Field Programmable Gate Array devices (FPGA). The method and system aid in emulation and prototyping of Application Specific Integrated Circuits (ASIC) digital circuit designs by means of reprogrammable devices. The system includes a design verification manager and software program that includes subroutines of finding clock sources, finding synchronous primitives that are receiving clock signals from the clock sources, and a subroutine for inserting edge detector circuits between such clock sources and synchronous primitives. This new method allows eliminating of clock timing issues by applying basic design clocks to the clock enable instead of clock trigger inputs and generating and applying to clock trigger inputs a new clock that is automatically delayed in respect to all other clocks in the design. This system solves the major obstacle for automatic retargeting of ASIC designs into reprogrammable devices that have different timings of the clocking chains in ASICs and FPGAs that result in triggering of associated flip-flops and latches at different times.

9 Claims, 10 Drawing Sheets

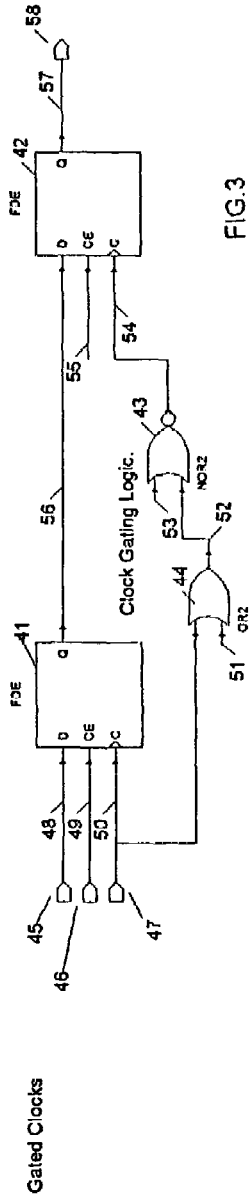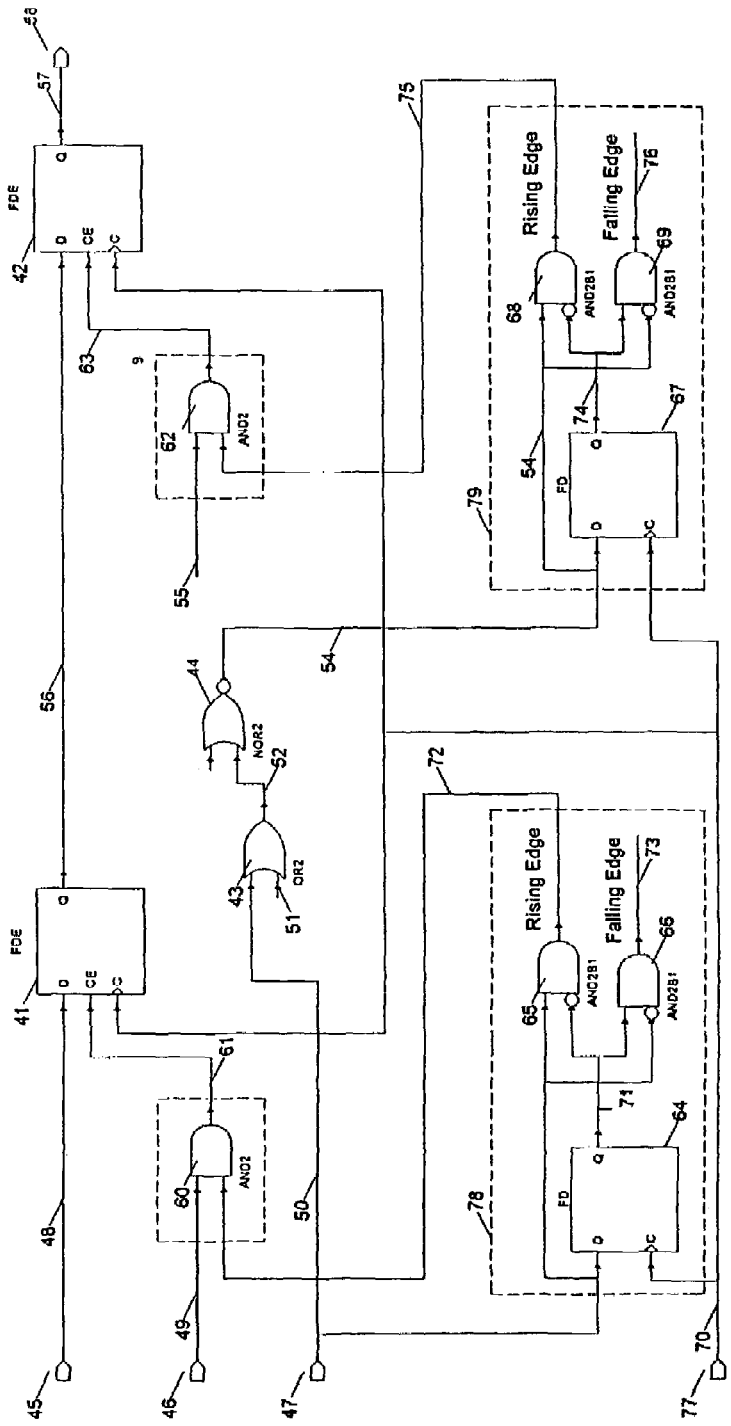
FIG. 3
FIG. 4

METHOD AND APPARATUS FOR ACCELERATING THE VERIFICATION OF APPLICATION SPECIFIC INTEGRATED CIRCUIT DESIGNS

BACKGROUND OF THE INVENTION

1. Field of the Invention

The present invention relates to verification of electronic circuit designs and more particularly to accelerating verification of current circuit design by the acceleration of software simulators and emulation of electronic designs by means of reprogrammable devices such as a Field Programmable Gate Array (FPGA). More particularly the invention can relate to the accelerated verification by automatic retargeting of Application Specific Integrated Circuits (ASIC) designs and High Definition Logic (HDL) designs in general, into reprogrammable devices of the specified kind.

2. Background Information

Today's ASIC designs have tens of millions of gates. To verify these designs, software simulators such as the NC-Sim from Cadence Design, VCS Simulator from Synopsys and Riviera and an Active-HDL from Aldec, Inc. of Las Vegas, Nev. may be used. However, since the number of gates in ASIC designs is growing faster than the speed of computers, there is a need to accelerate the operation of design simulators to verify these designs.

One approach is to simulate at higher levels of abstraction such as the simulator by SystemC, Behavioral VHDL, or SystemVerilog. However, these simulators require sophistication and costly compilers that are still under development, and their performance gains are not sufficient for efficient verification of the newest and largest ASIC devices.

Another approach is to accelerate the existing software simulators or use emulation in place of simulation altogether. Such accelerators and emulators, based on reprogrammable devices, have been manufactured by Quickturn, Inc. and Ikos, Inc. Their major drawback is that in order to reproduce basic design behavior in reprogrammable devices, hundreds of engineering hours must be spent on manual conversion of ASIC clocking chains into clocking chains running in the FPGA devices.

The power dissipation has become such an enormous problem in the large ASIC design devices that they employ as many as 20 or 40 clocks instead of one system clock that synchronizes all data transfers between flip-flops and latches. Since gates and their interconnections in reprogrammable devices have different timings from gates and interconnection in the ASIC design, an enormous amount of mental effort and time is needed to assure reliable conversion of ASIC designs into reprogrammable devices so they can emulate ASIC design behavior. The purpose of the present invention is to insure automatic conversion of ASIC designs into reprogrammable devices.

It is therefore one object of the present invention to accelerate the verification of new, very large ASIC designs.

Yet another object of the present invention is to provide a system and apparatus for accelerating the verification of very large ASIC designs by accelerating the simulation of the designs.

It is one object of the present invention to provide automatic conversion of ASIC designs into reprogrammable devices for quick, functional verification of the designs. This is accomplished by automatic conversion of ASIC clocking chains into clocking chains in reprogrammable devices so that these devices will behave functionally the same as the ASIC device.

Furthermore, another object of the present invention is to handle clocking of various flip-flops and latches, so that a wide variety of ASIC designs can be handled effectively and effortlessly by hardware accelerators, emulators and various ASIC prototyping equipment.

Still another object of the present invention is to provide a system and apparatus for accelerating the verification of very large ASIC designs by finding synchronous primitives in a circuit design files that are receiving clock signals from a clock source and inserting edge detectors such as between the clock sources and the synchronous primitives.

Yet another object of the present invention is to provide a method and apparatus for accelerating the verification of ASIC designs by finding synchronous primitives that do not have a clock enable input and replacing them with a synchronous primitive having a clock enable input.

Still another object of the present invention is to provide a method and apparatus for verification of ASIC designs including design verification managing software that analyzes connection between inputs of synchronous primitives and outputs from asynchronous primitives and insertion of a data buffer between these inputs.

Still another object of the present invention is to provide a method and apparatus for verification of ASIC designs in which the verification manager software finds falling-edge clocked primitives and substitutes rising clock-edge primitives for the falling clock-edge primitives.

Yet another object of the present invention is to provide an apparatus and method for verification of very large ASIC designs in which design verification manager software includes memory for storing ASIC designed files, design verification. manager software for processing the design files and simulator software for simulating the design files or selected parts thereof.

Yet another object of the present invention is to provide a method and apparatus for accelerating the verification of ASIC designs having a computer for storing design files, design verification manager software, simulation software and test bench files for stimulating simulator operations and a hardware accelerator. The design verification manager software splits design files into selected simulation files and hardware execution files that are downloaded into selected simulation files in said simulator and into selected hardware execution files in said hardware accelerator.

BRIEF DESCRIPTION OF THE INVENTION

The purpose of the present invention is an improved method and apparatus that will greatly accelerate the simulation and verification of ASICs. The invention disclosed herein is a complete ASIC design verification method and apparatus in an environment comprised of a simulator and hardware accelerator. Some ASIC design sections are assigned to software simulator and some to hardware accelerator. Yet all design sections operate as one unit because both simulator and accelerator are tightly interconnected through signal lines.

The ASCI design data is entered through a keyboard, mouse device or any other data entry device. The design can also be prepared offline on another computer employing the same arrangement as in FIG. 1 and thus falling within the scope of this invention. The newly created ASIC design files are stored temporarily in Random Access Memory (RAM) and permanently on computer hard disk.

The data entry device are also used to set up the communications link between the simulator and accelerator. The set-up affects an Input/Output (I/O) control program subroutine located in a design verification manager (DVM), which controls the flow of data between the design simulator and hardware accelerator. As part of that setup, the user may indicate to the DVM, which simulator and accelerator test points will be observed, and which simulator signal data will stimulate which accelerator test points, and vice versa.

Since there are typically hundreds of signals running between design sections in a simulator and target hardware, a buffer is needed for storing all signals going in each direction and applying them to the simulator and/or target hardware at the appropriate time. Because the transfer of signal data between simulator and hardware accelerator takes place over a 32-bit Peripheral Component Interface (PCI), all data are also partitioned into 32-bit data segments. Should a 64-bit PCI be used, a 64-bit partition preferably should be used. The data can also be sent over a Uniform Serial Bus (USB) or Ethernet bus or other buses as well. The buffer that stores signals going from the target hardware to the simulator is called the input signal buffer. For example, if the target hardware is supplying 80 signals to a simulator three (3) 32-bit words will typically be used in the input buffer. Similarly, if a simulator is providing 100 signals to the target hardware, a set of four (4) 32-bit registers will be used in the output buffer. Because the hardware accelerator requires simultaneous application of all signals, two sets of buffers are needed in the output buffer. The first set of buffers, called temporary buffers, collects data sent from the simulator, and when all signals for a selected test vector have been stored in that buffer, they are transferred on a single clock edge into the "driver" buffer that drives directly the target hardware.

The input signal buffer feeds target hardware generated signals to the design simulator. The design simulator can also trigger an I/O program subroutine to transfer signal data from memory locations being under simulator control to the appropriate channels within the output signal buffer that controls the hardware accelerator. The output signal buffer provides data to the target hardware through a plurality of lines. This data transfer is triggered by completion of a simulation cycle.

If the target hardware includes a processor it should generate an interrupt that directs the simulator to read data from input buffer. A signal scan technique can also be used in place of an interrupt but it is not recommended because it is slower. If the target hardware does not include a processor, the reading from the input buffer is taking place at a predetermined timeout that is needed for target hardware to reach its steady state after any signal transition on its input.

Any time the hardware accelerator generates an interrupt, the data input program subroutine in the simulator transfers data from the input signal buffer to the associated RAM locations. Following the data transfer, a program subroutine checks if there are any changes between the newly loaded signals and the old data at the same memory locations. If there are no changes, no action is taken by the simulator, and the program subroutine waits for a new interrupt.

However, if the new data read from the target hardware is different from the previous data, then the subroutine will activate operation of the design simulator, which will process the newly received data, performing a simulation step. Next, another subroutine will monitor the simulator outputs to see if they have achieved a steady state. Once the outputs have achieved a steady state, another subroutine will start data transfer to the output buffer that will in turn start hardware accelerator operations.

The above and other objects, advantages, and novel features of the invention will be more fully understood from the following detailed description and the accompanying drawings, in which:

BRIEF DESCRIPTION OF THE DRAWINGS

FIG. 3 shows a typical ASIC design with two clock domains and race conditions.

FIG. 4 shows a design with two clock domains converted into a single clock domain.

DETAILED DESCRIPTION OF THE PREFERRED EMBODIMENTS

Figure 1:
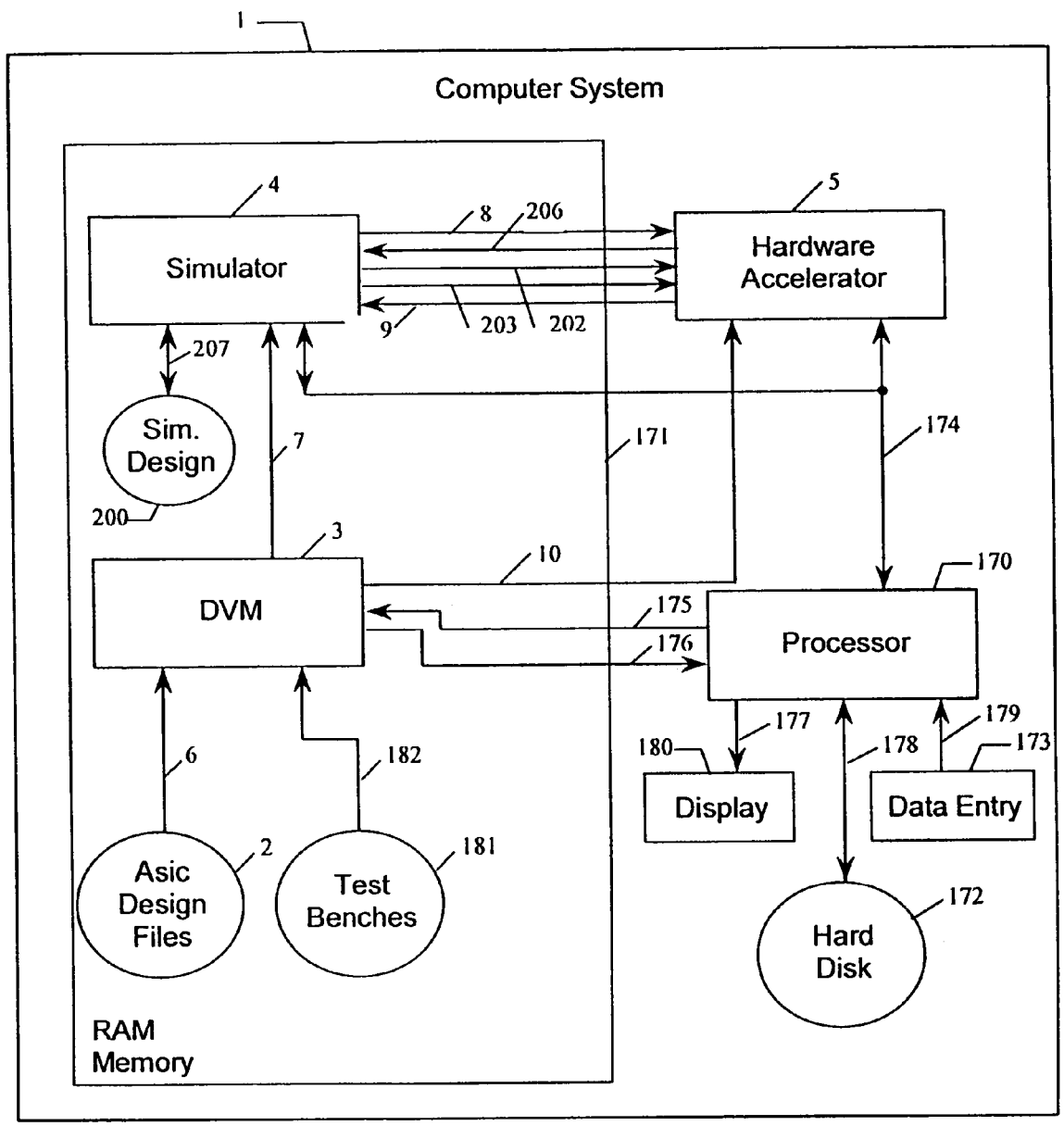
FIG. 1 is a block diagram of a computer system running a design simulator and employing hardware accelerator.

A block diagram illustrating a computer system 1 for design verification and automatic ASIC prototyping by means of reprogrammable devices is illustrated in FIG. 1. Computer system 1 can be a workstation such as a SunBlade 1000 manufactured by Sun Microsystems or a personal computer (PC) available from a number of manufacturers such as Dell, Hewlett-Packard, etc. Computer system 1 is comprised of processor 170, random access memory (RAM) 171, hard disk storage 172, data entry device 173 and display or monitor 180. While a variety of input devices or data entry devices can be used for simplicity, we will refer to data entry device 173 most frequently as a keyboard.

In addition, computer system 1 includes software simulator 4 residing in computer memory 171, a reprogrammable hardware accelerator 5 comprised of one or more reprogrammable devices that can be programmed with design sections, and Design Verification Manager (DVM) software 3 for converting ASIC designs to a format suitable for implementation in reprogrammable hardware accelerator 5. DVM software 3 can also be used to convert complex programmable logic device (CPLD) and FPGA designs made for one device family into designs operating on another CPLD or FPGA device family.

Simulator 4 can be any of the popular simulators such as a NC-Sim manufactured by Cadence Design, Inc. or Active-HDL manufactured by Aldec, Inc. of Las Vegas, Nev. Hardware accelerator 5 can be a hardware embedded simulation (HES) product made by Alatek Sp. z o.o. DVM 3 is a product offered by Alatek, Inc. and can be used for fitting HDL and netlist designs into field programmable devices such as a Virtex II manufactured by Xilinx, Inc. and Stratix manufactured by Altera, Inc.

Each ASIC design is comprised of design files 2. Design files 2 are fed into a set of software subroutines in DVM 3, which under the user control separates them into design files being processed by simulator 4 and hardware accelerator 5. Splitting design files subroutine 231 (FIG. 13) is responsive to user inputs and divides ASIC design files 2 provided on signal line 230 into selected simulation files 233 and selected hardware execution files 235. Both selected simulation files 233 and selected hardware execution file 235 are stored, via signal lines 232 and 234, respectively, in RAM memory 171. Selected simulation files 233 are sent over signal line 7 into software simulator 4 and selected hardware execution files 235 are fed over signal line 10 into hardware accelerator 5. Typically, a user will send those design files that had fewer signal transitions and thus will simulate faster to simulator 4. On the other hand, design files 2 with a large number of signal transitions produced by a typical testbench stimuli file will be directed to hardware accelerator 5. Most software simulators 4 such as Riviera from Aldec, Inc. and ModelSim from Mentor Graphics, Inc. have "profiler" software that can scan designs and determine, which section of design files 2 has the most and least signal transitions.

To provide for direct interaction between selected simulation files 233 and selected hardware execution files 235, finding test points feeding data from simulator to hardware accelerator subroutine 237 and finding test points feeding data from hardware accelerator to simulator subroutine 241 analyze the design files 233 and 235, produced on signal lines 236 and 240, and determine common signals or test points between them. Specifically, Finding Test Points Feeding Data from Simulator to Hardware Accelerator subroutine 237 determines which simulator 4 test points should be feeding data into hardware accelerator 5. The list of these test points is fed over signal line 238 to selected hardware execution (SHA) database 239. Similarly, Finding Test Points Feeding Data from Hardware Accelerator to simulator subroutine 241 analyzes data produced on signal lines 240, that includes selected simulation files 233 and selected hardware execution files 235, and produces a list of test points feeding data from hardware accelerator 5 outputs to simulator 4 inputs. Finding Test Points Feeding Data from Hardware Accelerator to simulator subroutine 241 feeds the list of these test points over signal line 242 into selected hardware execution (HAS) database 243.

Figure 12:
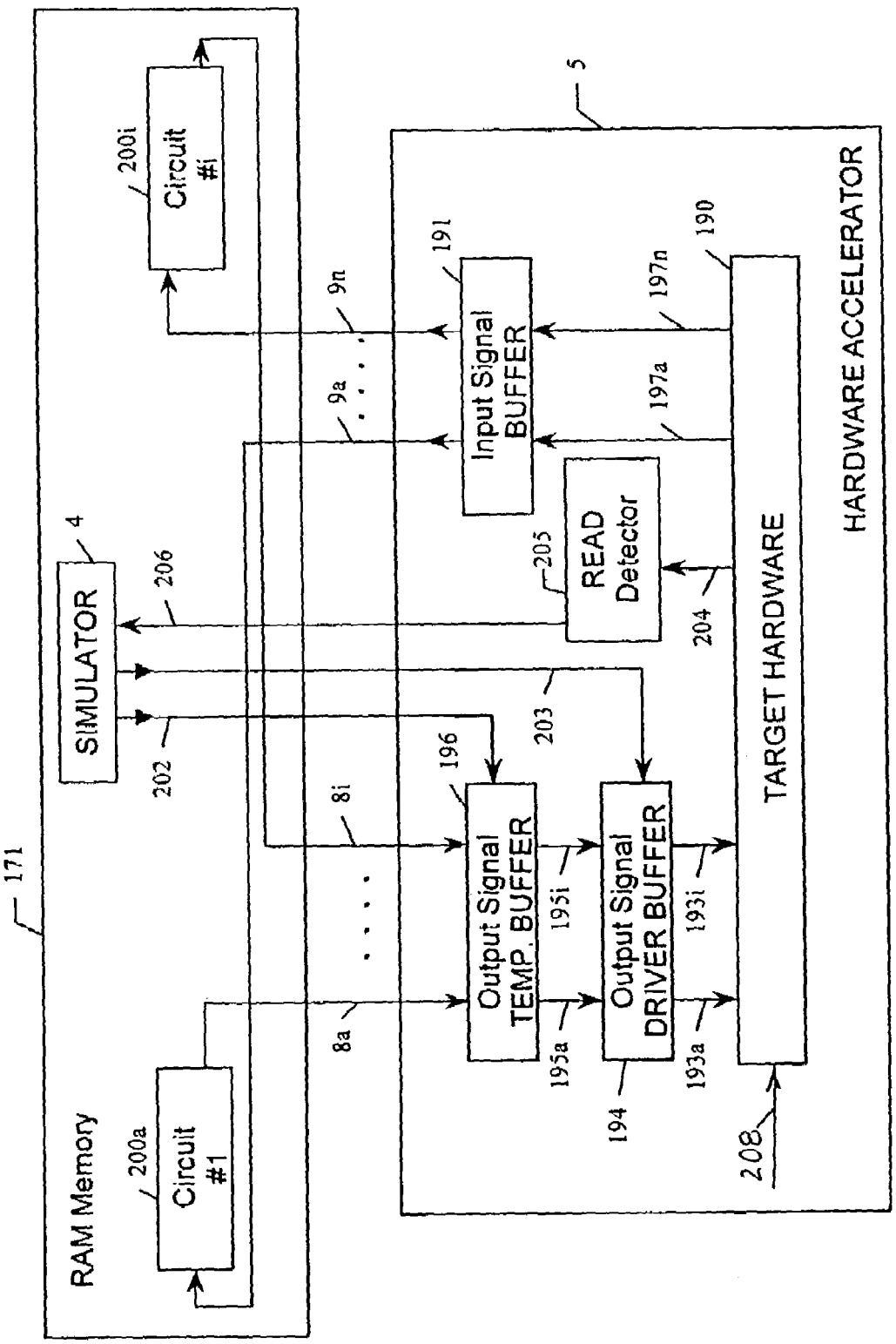
FIG. 12 is a block diagram illustrating the connectivity between hardware and software verification blocks.

DVM 3 software uses SHA database 239 data to instruct transferred data to temporary buffer subroutine 221 (FIG. 14), which signals controlling hardware accelerator 5 should be transferred into temporary buffer 196 (FIG. 12). Similarly, DVM 3 uses HAS database 243 to control the read input signal buffer subroutine 213 (FIG. 14) and load the necessary signal data into simulator 4. Summarizing, after simulator 4 completes its internal operations, it outputs signals that stimulate hardware accelerator 5 operation. In return, once the hardware accelerator 5 operation achieves stable-state, it sends a signal that controls simulator 4 operations. This "ping-pong" like operation goes on until all test benches 181 (FIG. 14) fed into simulator 4 via signal lines 182, DVM 3 and signal lines 7, or data on signal lines 208 feeding into target hardware 190 (FIG. 12) have been completed.

Figure 2:
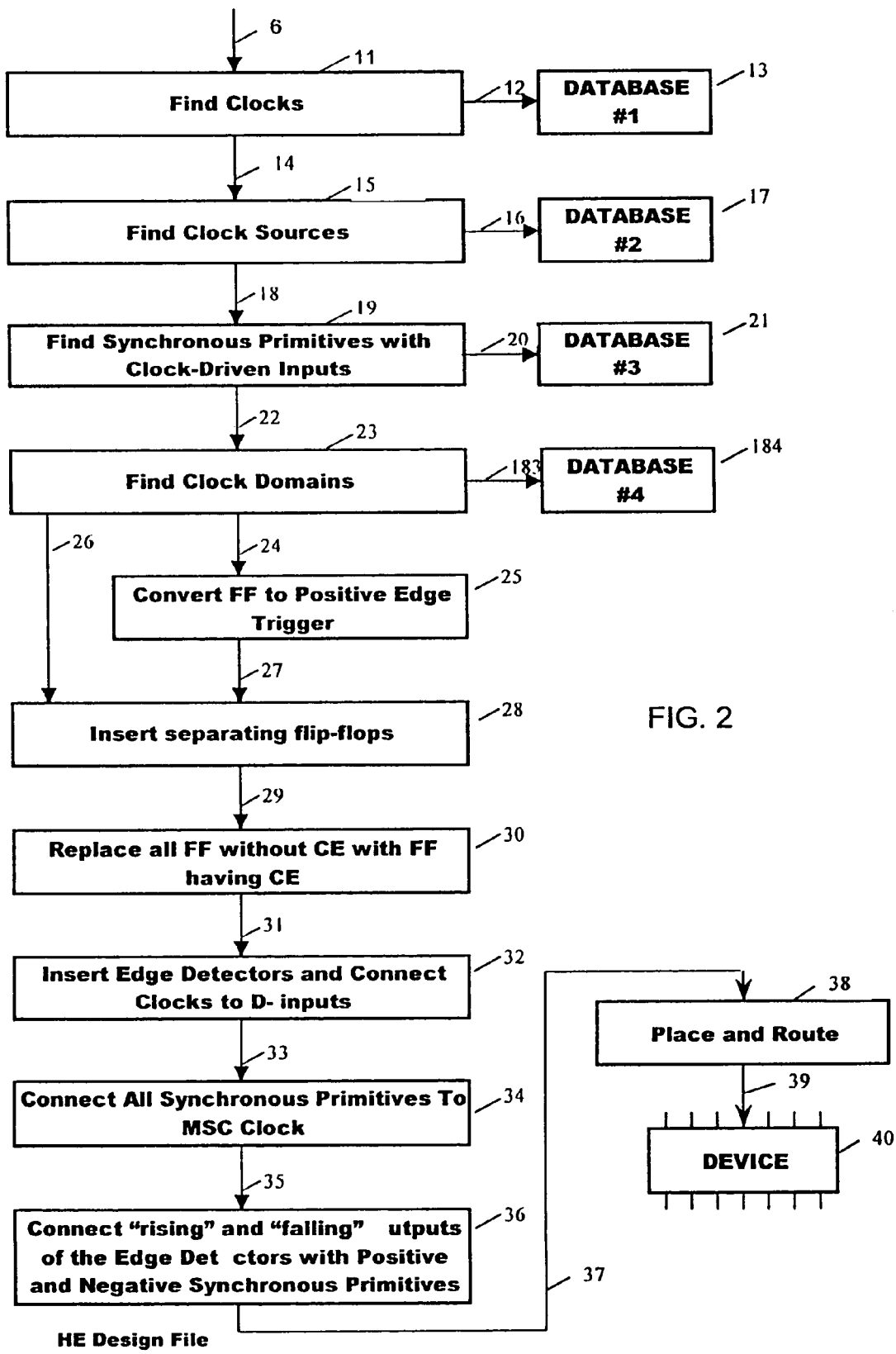
FIG. 2 is a flow diagram listing software subroutines for converting design files from ASIC applications to FPGA implementations.

DVM software 3 is comprised of subroutines listed in the flow diagram of FIG. 2. Find clocks software subroutine 11 scans design files 2, provided on signal line 6, for design clocks, also called user clocks and sends their names and data over signal line 12 to find clocks database 13 (Database #1). Find clocks sources subroutine 15 receives pre-processed design files 2 on lines 14 that include a list of design clocks. Find clock sources subroutine 15 scans design files 2 for the sources of clocks provided on signal lines 14, and sends a list of the clock sources over signal line 16 to find clock sources database 17 (Database #2). The list of clocks 13 and clock sources 17 is also provided on line 18.

Figure 5:
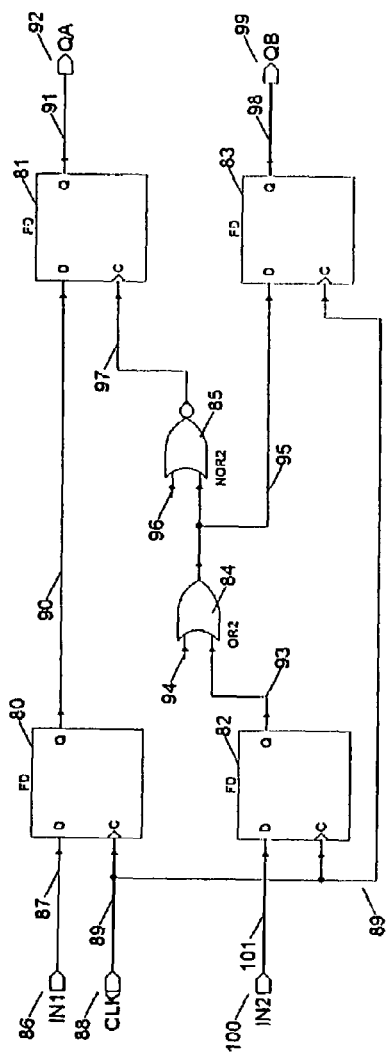
FIG. 5 shows a design with a D-type flip-flops, two clock domains and race conditions.

The invention is based on finding "clock sources" and "clock-dependent inputs", and applying to them the appropriate circuit transformations or algorithms. The clock source is a flip-flop or a latch that drives clock input pin of another latch or flip-flop. For example, flip-flop 82 in FIG. 5 is a "clock source" because it generated a signal on signal line 93 that feeds the clock input of flip-flop 81 via gate 84, signal line 95, gate 85 and signal line 97. Flip-flop 82 is also a "clock source" because it drives the synchronized D-input of flip-flop 83 via signal line 93, gate 84 and signal line 95. Primitives such as 84 and 85 that do not have clocked outputs are called asynchronous primitives. If such asynchronous primitives drive D or clock inputs of flip-flops, it may be a cause of unpredictable circuit behavior from one device layout to another. This invention eliminates the effects of asynchronous primitives in circuit operation.

Find clock subroutine 15 will find flip-flop 82 to be a "clock source" by analyzing synchronous inputs to flip-flops such as 81 and 83. Starting at the C-clock input to flip-flop 81, find clock sources subroutine 15 traces signal line 97 to the output of gate 85. Next, find clock sources subroutine 15 examines input to gate 85. By tracing signal line 95, find clock sources subroutine 15 locates gate 84. By analyzing signal line 93, connected to one of the inputs of gate 84, find clock sources subroutine 15 finds flip-flop 82 and according to the definition employed and described hereinabove declares flip-flop 82 to be the "clock source".

The synchronous primitives with "clock-driven inputs" are flip-flops and latches that have their synchronous inputs such as D-input of flip-flop 83, connected to "clock source" signal line such as signal line 95, which was identified earlier by find clock sources subroutine 15 as being connected to a "clock source". Because of that, find synchronous primitives with clock-driven input subroutine 19 will identify primitive 83 as having a clock-driven input. Find Synchronous Primitives with Clock-Driven Inputs software subroutine 19 processes design data provided on signal line 18 and identifies primitives that have synchronous inputs such as preset, reset, enable, or data input connected in any way to a "clock source", and saves this data in find synchronous primitives database (Database #4) 184. In addition, find synchronous primitives database data is provided on lines 22, together with design file 2 data and find clocks database 13 and find clock sources database 17 information.

Find clock domains subroutine 23 analyzes data on signal lines 22 and groups all synchronous primitives by the associated clock-driven input signal lines. Groupings of primitives by the clock name such as signal line 97 or clock-related signal lines such as signal line 95 are called clock domains. Clock domains are provided on signal lines 181 to find clock domains database (Database #4) 184. This grouping of related primitives is important because one edge detector will be enough to drive all primitives in the given clock domain.

In addition, find clock domain subroutine 23 separates positive-edge triggered primitives from negative-edge triggered primitives and provides them on signal lines 26 and 24, respectively.

The four databases 13, 17, 21, and 184 (#1–#4) are created for viewing by the designer, and can be displayed by computer 1 on its display or monitor 180 under any of the available software such as Microsoft Word, Active-HDL and similar software.

Since for reliable operation all clocked primitives should trigger on the same clock edge, all negative edge triggered primitives must be converted to positive edge triggered primitives. Convert flip-flop to positive edge trigger subroutine 25 analyzes data on signal line 24 and substitutes positive-edge clocked primitives for negative edge clocked primitives. The list of new positive-edge clocked primitives is produced on signal line 27. A standardized design on negative-edge triggered primitives instead of positive-edged triggered primitives as specified above is fully within the scope of this invention.

Figure 6:
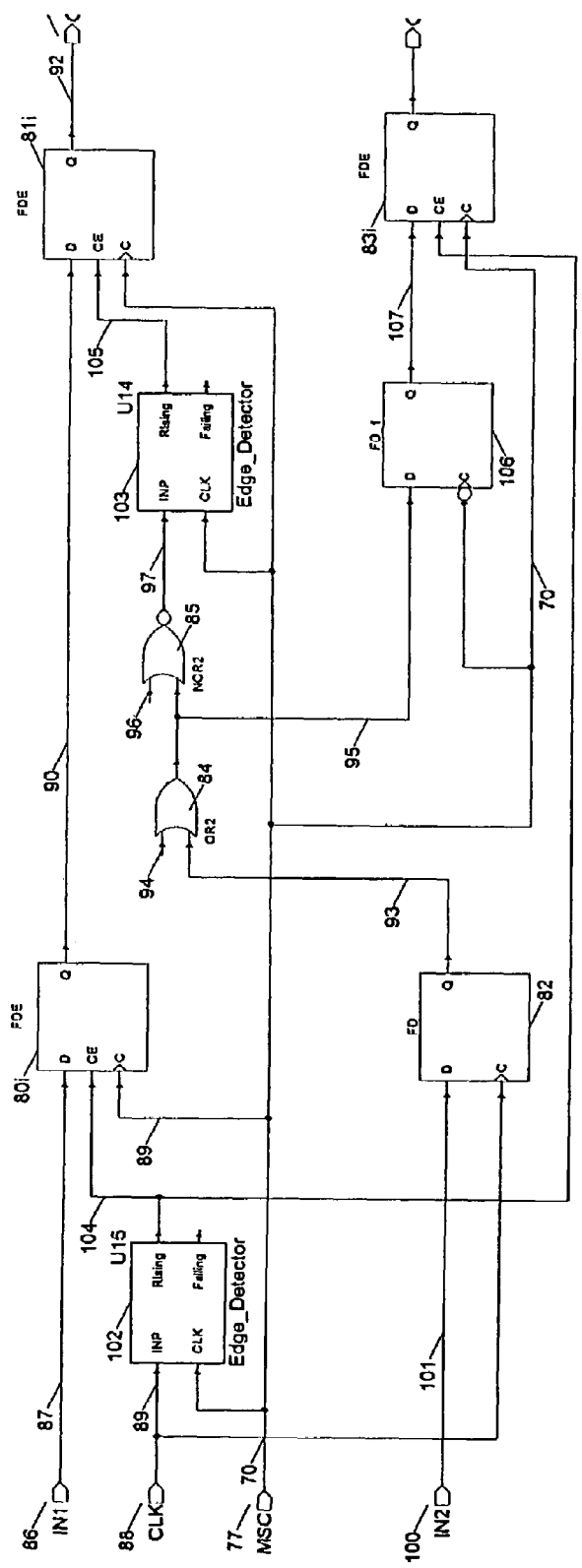
FIG. 6 shows a D flip-flop based design converted into a single clock domain.
Figure 7:
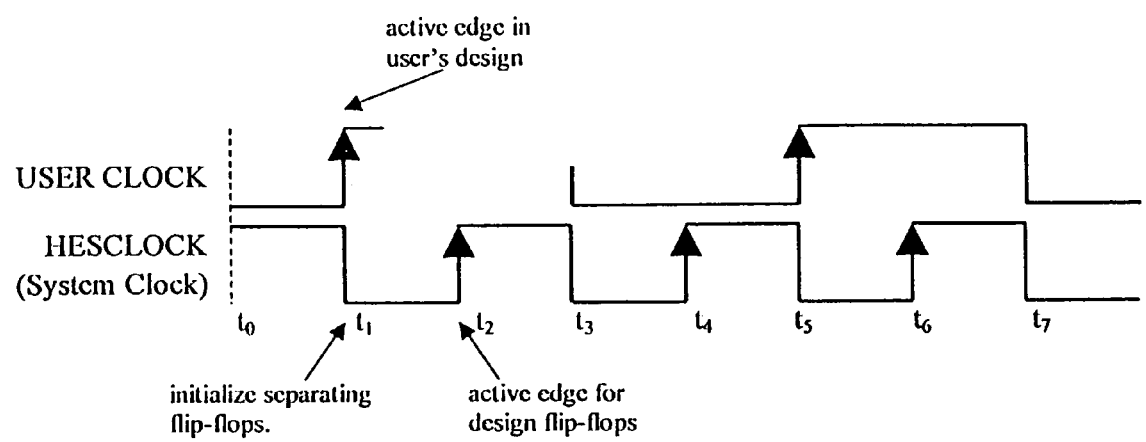
FIG. 7 is a diagram illustrating clock timing.

Since all clock-driven inputs of clocked primitives must be stable prior to the main system clock's (MSC) positive transition, insert separating flip-flop subroutine 28 adds a buffer or "separating" flip-flops on the inputs to such primitives. These buffer flip-flops, such as flip-flop 106 in FIG. 6 are triggered prior to the system clock's positive transition. For example, they can be triggered on the negative edge of the MSC clock, as shown in FIG. 7.

Preferably, clock sources, such as flip-flop 82, are controlled directly by the original user CLK clock, without applying any edge detectors. Because of that a buffer, such as flip-flop 106 is needed to stabilize the synchronized inputs to the primitives with clock-driven inputs such as primitive 83i.

The present invention is configured on the idea that the CLK user clocks, which have vastly different timings when ported from ASIC to FPGA devices, should not clock any synchronous primitives, except clock sources such as primitive 82. All CLK user clocks are used instead as clock enable (CE) signals for triggering primitives with the MSC signal 70 that has been developed for triggering all synchronous primitives in the entire design. To implement this concept replace all FF without CE with FF having CE scans data files provided on signal line 29 and identifies which clock primitives do not have "clock enable" or CE inputs. Replace all flip-flops without CE with flip-flops having CE subroutine 30 will replace all such primitives with equivalent primitives but having a CE input. For example, the primitives 80, 81, and 83 in FIG. 5 have been replaced with flip-flops having CE by subroutine 30 with 80i, 81i, and 83i primitives, as shown in FIG. 6.

To apply the user clock signals to the CE clock enable (CE) inputs, their transition must be detected by an "edge detector" such as edge detector circuit 79 in FIG. 4, and then applied to the CE input. A detail description of the edge detector operation will be provided hereinafter with reference to FIG. 4.

Insert edge detectors and connect clocks to D-inputs subroutine 32 receives preprocessed design data on signal line 31 and inserts "edge detectors" into the design so that the local or user clocks are applied to clock enable inputs of synchronous primitives instead of their clock inputs. MSC clock signal 70 is applied to the clock input of these synchronous primitives, such as 81i, so that all these primitives will be able to respond to the same rising, or falling, edge of MSC signal 70, being the system clock.

Connect all synchronous primitives to MSC clock subroutine 34 connects MSC signal 70 to clock inputs of all clocked primitives provided on signal lines 33. Since the design still must respond to rising and falling edges of the local or user clocks, connect edge detectors outputs subroutine 36 responds to design data on signal line 35 and connects either the rising edge or falling edge of the local clock edge detector to the CE input of the selected primitive. For example, connect output edge detectors output subroutine 36 (FIG. 2) outputs this imposed design on signal lines 37 as the hardware embedded (HE) design file. The HE Design File is fed over signal line 37 to place and route software subroutine 38 such a ISE 5.1 from Xilinx, Inc. which produces a bit stream file for downloading the improved design over signal line 39, being now in a bit format, into FPGA device 40.

The following description is in reference to drawings that further clarify the operation of the DVM 3 subroutines listed in the flow diagram of FIG. 2.

A design with two clock domains driven by the output signal lines 54 CLK clock and gate 44 is illustrated in FIG. 3. Because gates 43 and 44 inject their own time delays, the triggering of primitive 42 may take place at an inappropriate time, creating a race condition. To eliminate this race condition, subroutines in the flow diagram of FIG. 2 make a conversion of the circuit in FIG. 3 into the circuit of FIG. 4. Find clocks subroutine 11 finds signal lines 50 and 54 to be clock signal lines. Find clock sources subroutine 15 identifies CLK terminal 47 as an external user clock signal and signal 54 as the user clock produced by gate 44 directly from the external user clock on signal line 50. Since the user clock on signal line 50 is generated by gate 44 and not by a flip-flop, gate 44 is not a "clock source" as defined hereinabove within the meaning of this invention because only flip-flops and latches can be independent "clock sources".

By the definition employed in this invention, only "clock sources" can result in primitives with "clock-driven inputs". Since find clock sources subroutine 15 found no "clock sources" in FIG. 3, no search for "clock-driven inputs" will be performed by find synchronous primitives subroutine 19.

Find clock domains subroutine 23 will find flip-flops 41, 42 as being positive-edge triggered and that information will be sent on signal lines 26. No negative-edge triggered flip-flop data will be sent on signal line 24 because subroutine 23 found no such devices in design data (FIG. 3) provided on signal line 22.

Find Clock Domains subroutine 23 will find that there are in FIG. 3 two clocks driving inputs to synchronized primitives, thus we have two "clock domains": CLK clock provided on signal line 50 and signal line 54 being an output of gate 44. Should there be several pins connected to each clock signal line, such as signal lines 50 and 54, find clock domains subroutine 23 will list all primitives for each clock domain. Since all primitives in FIG. 5 were positive edge triggered, there was no need to invoke convert flip-flop to positive edge trigger subroutine 25. Also, because all flip-flops in FIG. 3 have CE inputs, no replacements with CE type flip-flops have been performed by the replaced flip-flop subroutine 30.

Since find clock domains subroutine 23 identified primitives 41 and 42 as synchronous primitives, insert edge detectors subroutine 32 will insert "edge detectors" 78 and 79 on inputs, respectively. MSC signal line 70 will set "edge detector's" 79 flip-flop 67 with an output Q to a logical "0" at time t4 (FIG. 7). After time t5, plus propagation delay of gates 43 and 44, gate 68 the output will be a logical "1" enabling the CE input of flip-flop 42 via AND gate 62. At time t6 MSC signal will trigger primitive 42 via signal line 70. Operation of edge detector 78 is similar to detector 79.

Connect all synchronous primitives to MSC clock subroutine 34 has connected MSC signal line 70 to clock inputs of primitives 41 and 42, and a single clock line 70 is visible in FIG. 4. Since primitives 41 and 42 were positive edge triggered flip-flops, connect edge detectors output subroutine 36 has connected the rising edges 72 and 75 of edge detectors 78 and 79, respectively, to the CE inputs of the corresponding synchronous primitives 41 and 42. Since primitives 41 and 42 have been connected to CEA and CEB enable signals, respectively, AND gates 60 and 62 have been added to logically AND the CEA and CEB signals with rising Edge Signals 72 and 75, respectively. FIG. 4 exemplifies how software subroutines in the flow diagram of FIG. 2 have been used to process the design illustrated in FIG. 3. The additional hardware in FIG. 4, as compared to FIG. 3, allows automatic elimination of clock skews and race conditions and saves months from the design verification schedule.

Since synchronous primitives 80, 81, and 83 in FIG. 5 do not have the CE inputs, replace all flip-flops subroutine 30 has replaced these primitives with 80i, 81i, and 83i, respectively, all having CE inputs, as shown in FIG. 6. Because find clock sources subroutine 15 found clock source primitive 82, and primitive 83 had a race condition signal 95 connected to its D input, a "buffer" or separating flip-flop 106 has been added by insert separate flip-flops subroutine 28. Buffer 106 is triggered by negated MSC signal on signal line 70 so that D input of flip-flop 83i is stable by the time the positive-edge MSC signal on signal line 70 is applied.

If a flip-flop is a clock source primitive as in the case with flip-flop 82, no "edge detector" is needed for such a flip-flop 82.

Synchronous flip-flops respond to clock edges on their clock inputs while synchronous latches respond to voltage levels on their "gating" inputs. For all practical purposes, the gate enable (GE) input of a latch behave similarly to the CE input of a flip-flop and the gate (G) input of a latch behaves similar to a flip-flop's clock input. For this reason, the DVM 3 software processes similarly the flip-flops and latches. FIG. 2 software subroutines 11, 15, 19, 23, 24, 25, 28, and 30 operate similarly on flip-flops and on latches.

Figure 8:
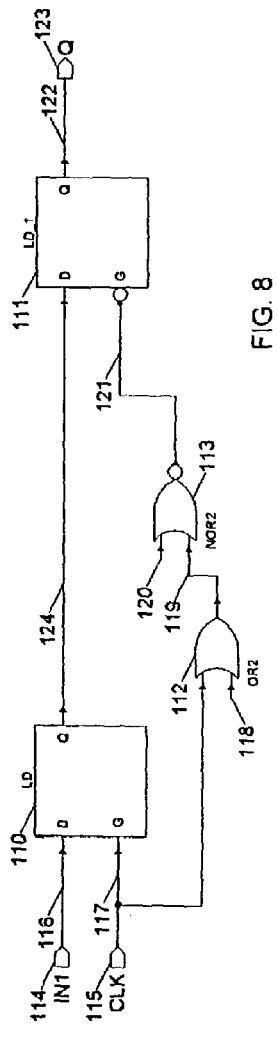
FIG. 8 is a block diagram of a circuit design with latches and race conditions.
Figure 9:
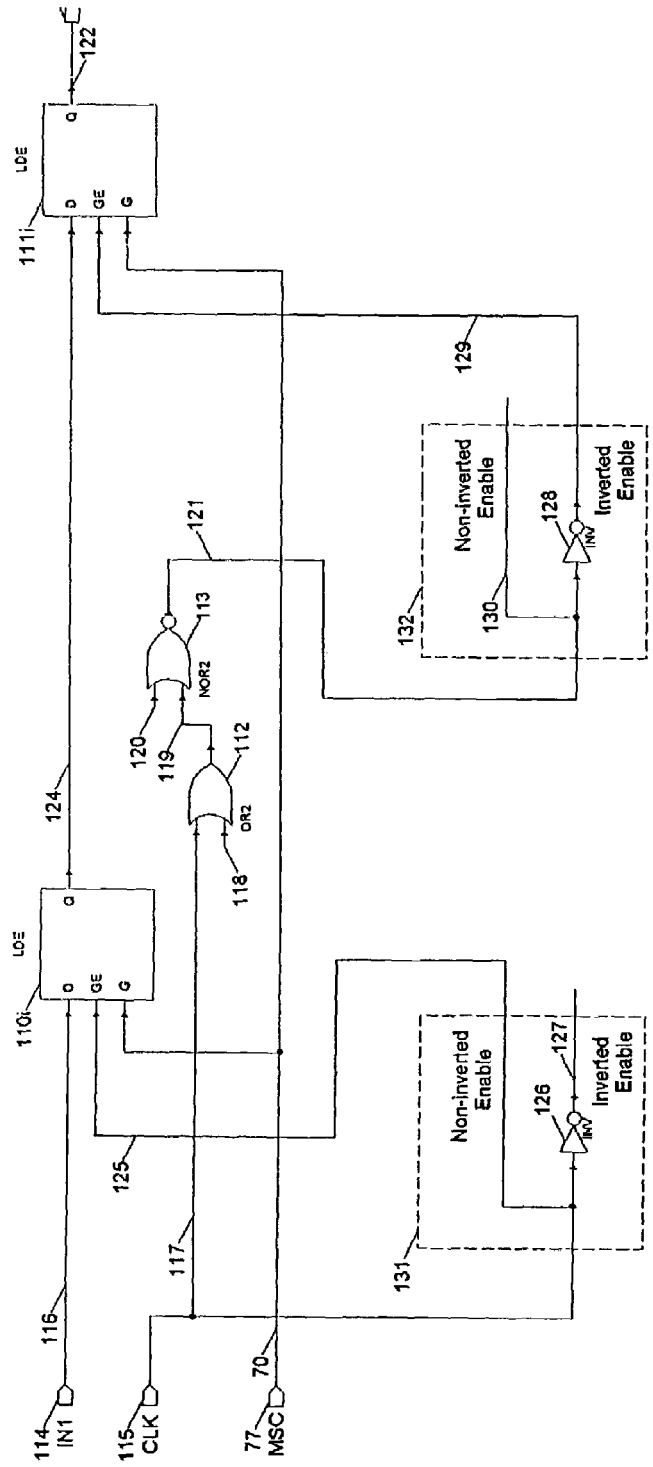
FIG. 9 is a block diagram of a latch-based circuit design without race conditions.

The circuit design in FIG. 8 illustrates a circuit with two latches 110 and 111. Since the latches do not have gating enable GE inputs, they are converted by replace all flip-flops subroutine 30 into latches with GE inputs 110i and 111i, respectively. Because latches are sensitive to voltage levels on their "gating" (clocking) inputs, insert edge detectors subroutine 32 inserts enable inverter 131 for latch 110i and another enable inverter 132 for latch 111i. Inverter enables 131 and 132 are triggered in FIG. 8 by voltage levels. Otherwise, they operate similarly to edge enable in FIG. 4.

Figure 10:
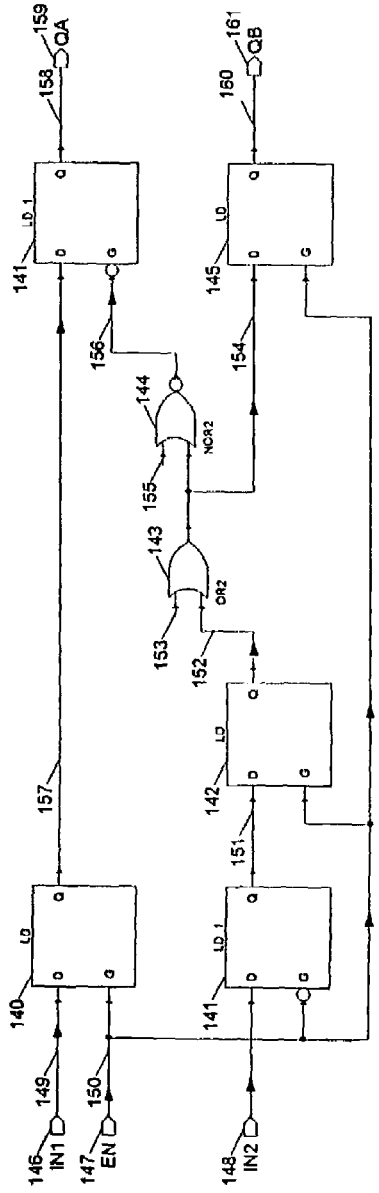
FIG. 10 is a block diagram illustrating another circuit design with latches and race conditions.
Figure 11:
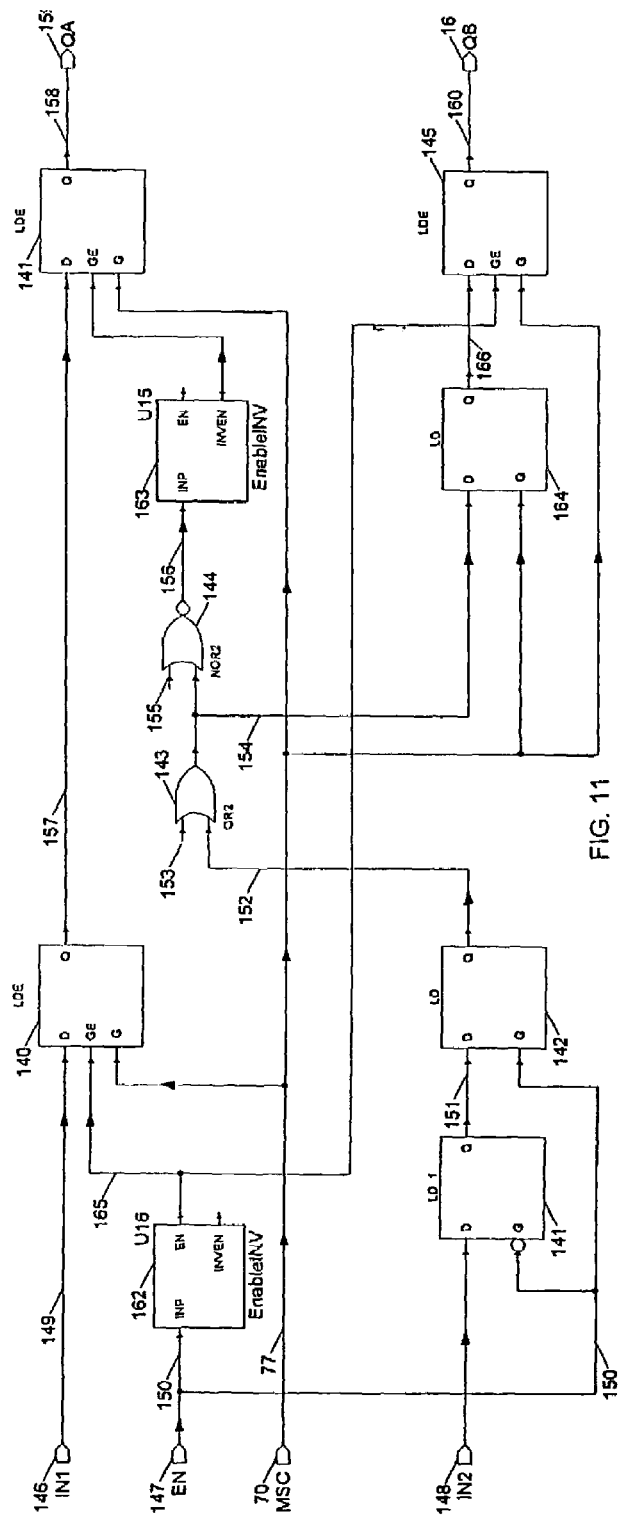
FIG. 11 is a block diagram illustrating another circuit design with latches and race conditions.

Sometimes there can be two or more latches connected serially, all of them being clock sources, as shown in FIG. 10. Such latches 141 and 142 should be treated as independent clock sources and shall be driven with their original signal line 150, as shown in FIG. 11. For this reason, final clock sources subroutine 15 does not stop at the first found latch 141 but checks if latch 142 does not have on its input yet another latch driver such as 141. Since latches 141 and 142 are clock drivers, they should not have on their inputs neither enable inverters, such as enable inverter 131, nor buffer latches such as buffer latch 164. It is very important that latches 141 and 142 be driven directly by the original input signals and produce their output signals at the earliest possible time.

After DVM 3 processes ASIC design files 2, it downloads selected design sections into simulator 4 via signal lines 7 for software simulation of their functional behavior. The selected design sections could actually reside in the same memory locations, which were occupied by ASIC Design Files 2 but the addressing and control over those memory locations is passed from DVM 3 to software subroutines located in simulator 4. To underscore the direct control of simulator 4 over those selected design sections, simulator design memory 200 has been added in FIG. 1. Simulator 4 exerts its control over simulated design sections, stored in simulator design logical memory 200, via signal lines 207. Simulator design logical memory 200 may be comprised of numerous locations in physical memory or RAM 171.

Using automatic ASIC into FPGA netlist conversion procedures described hereinabove, DVM 3 downloads via signal lines 10 the remaining design sections into the hardware accelerator 5, and specifically into target hardware 190, being preferably an FPGA. Signal lines 7 and 10 are used for downloading of selected design sections of design file 2 into simulator 4 and hardware accelerator 5, and for applying signal stimuli such as test benches 181.

Test benches 181 are typically developed by users through keyboard 173 entries and stored on hard disk 172 via signal line 179, processor 170 and signal line 178. For faster operations, test benches are typically saved in local RAM and then applied to simulator 4 and hardware accelerator 5. For this reason, test benches 181 are downloaded into memory from hard disk 172 via signal line 178, processor 170, signal line 175, DVM 3 software'subroutines controlling RAM 171 download operations on signal line 182. When directed by keyboard 173 entry or DVM 3 subroutine command, test bench signals are read via signal line 182 and applied via signal line 176, processor 170 and signal line 174 to simulator 4 and hardware accelerator 5. It needs to be noted that signal lines 7 and 10 can be implemented by a combination of signal lines 176, processor 170 and signal lines 174.

The hardware acceleration process, using simulator 4 and hardware accelerator 5 and their associated signal lines and software subroutines has been described in detail in U.S. Pat. No. 5,479,355 of Hyduke, issued Dec. 26, 1995, and incorporated herein by reference made hereto to the disclosure. Also, the operation of a software simulator has been described in detail in U.S. Pat. No. 5,051,938 of Hyduke, issued Sep. 24, 1991, and incorporated herein by reference, and therefore no detailed explanation of software simulator 4 operations is necessary. The nomenclature used in the aforementioned two patents is also applicable here.

The aforementioned selected design sections that have been downloaded into simulator design 200 logical memory are shown in greater detail in FIG. 12. since the design sections may be located at different areas of RAM 171, they are shown as simulator design circuits #1 through #i.

After the design sections have been loaded into simulator 4 and hardware accelerator 5, stimuli signals representing external signal events are applied either to the simulator 4 or hardware accelerator 5. For example, if simulator 4 simulates an UART device, then any signal received on the UART's input will stimulate the entire design comprised of design sections located in simulator 4 and hardware accelerator 5, because of interconnecting signal lines 8a through 8i and 9a through 9n. Similarly, if a USB device located in hardware accelerator 5 receives a data file over its input lines, it will trigger some operations in hardware accelerator 5 and then through signal lines 8a through 8i and 9a through 9n may cause a series of data exchanges between simulator 4 and accelerator 5 design blocks.

Since hardware accelerator 5 operates at very high clock speeds and simulator 4 operates at relatively slow software clock speeds, a synchronization of events in both hardware and software environments needs to be provided. FIG. 12 illustrates the distinct handling of signals flowing from simulator 4 to accelerator 5 and vice versa.

At the heart of hardware accelerator 5 is programmable target hardware 190 that stores the selected design sections that have been downloaded by DVM 3 into the hardware accelerator 5 via signal lines 10. All signals 193a through 193i that are applied to target hardware 190 must be applied at the same time because if these signals 193a through 193i are applied in a random order then random operation of target hardware will result. For this reason, when simulator 4 completes a simulation cycle and downloads its outputs to hardware accelerator 5, it does it in two steps. First, a series of bytes or words of data is loaded over numerous clock cycles into a "temporary buffer" 196. These words of data are stored in buffer 196 under control of a signal generated on signal line 202 by a software subroutine residing in simulator 4 and controlling data transfer from simulator 4 to buffer 196.

When all signals for hardware accelerator 5 are updated and present in buffer 196, a simulator 4 software subroutine that controls data transfer to hardware accelerator 5 issues a signal on signal line 203 that transfers data from temporary buffer 196 into driver buffer 194. This transfer should be accomplished in minimum time and with minimum time "skew" between channels. Typically, the skew will be on the order of one to a few nanoseconds.

The design sections in hardware accelerator 5 respond very fast to all signal transitions on its inputs, such as those presented on signal lines 193a through 193i. Typically, target hardware 190 will produce stable signals on its output signal lines 197a through 197n within a few nanoseconds after it has received new signals on signal lines 193a through 193i. This means that if hardware accelerator 5 does not include any microprocessors or delay lines, simulator 4 can read output signals 197a through 197n on its first software clock cycle after issuing a signal on signal line 203. Since place and route software subroutine 38 in FIG. 2 can calculate the longest path delay in target hardware 190, it can provide an advisory for simulator 4 after which time the subroutine hardware timeout 211 should read the new data provided by target hardware 190 on signal lines 197a through 197n. This time can be determined in terms of simulator 4 clock periods.

However, if the target hardware 190 includes a microprocessor, timers or delay lines, read detector 205 needs to be implemented. Each time a processor completes the required operations, each time a delay time is complete or each time a timer times out, a signal is produced by target hardware 190 on signal line 204 and read detector 205 generates an interrupt signal on signal line 206 that is read by simulator 4. In response to the interrupt signal on signal line 206, simulator 4 reads data from input signal buffer 191. Since the data on signal lines 197a through 197n is stable during reading by simulator 4, the input signal buffer 191 can be a multiplexer that selectively chooses under simulator 4 control of various test points in target hardware 5.

Figure 13:
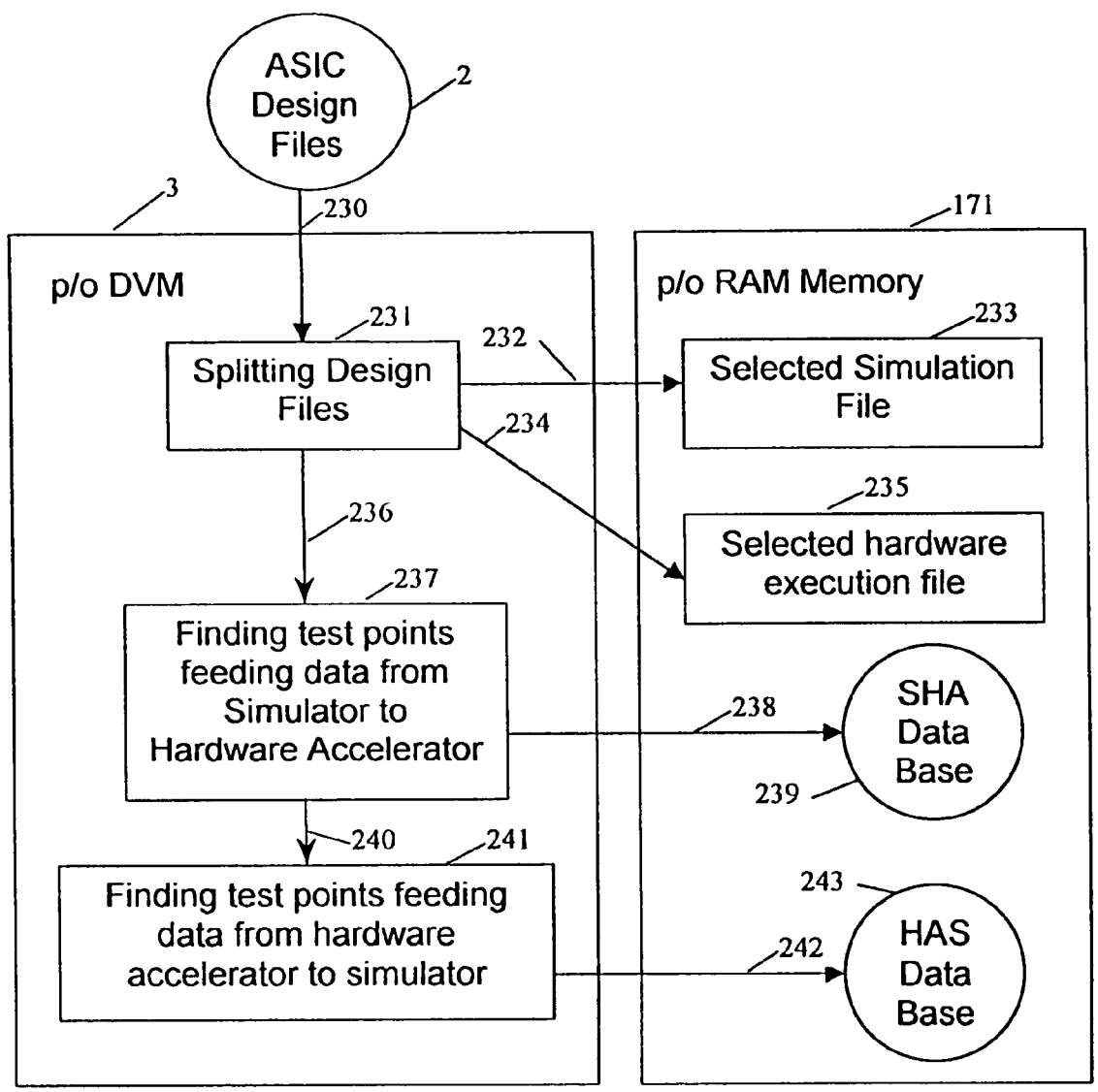
FIG. 13 is a block diagram illustrating a design being split into simulation and hardware acceleration files.
Figure 14:
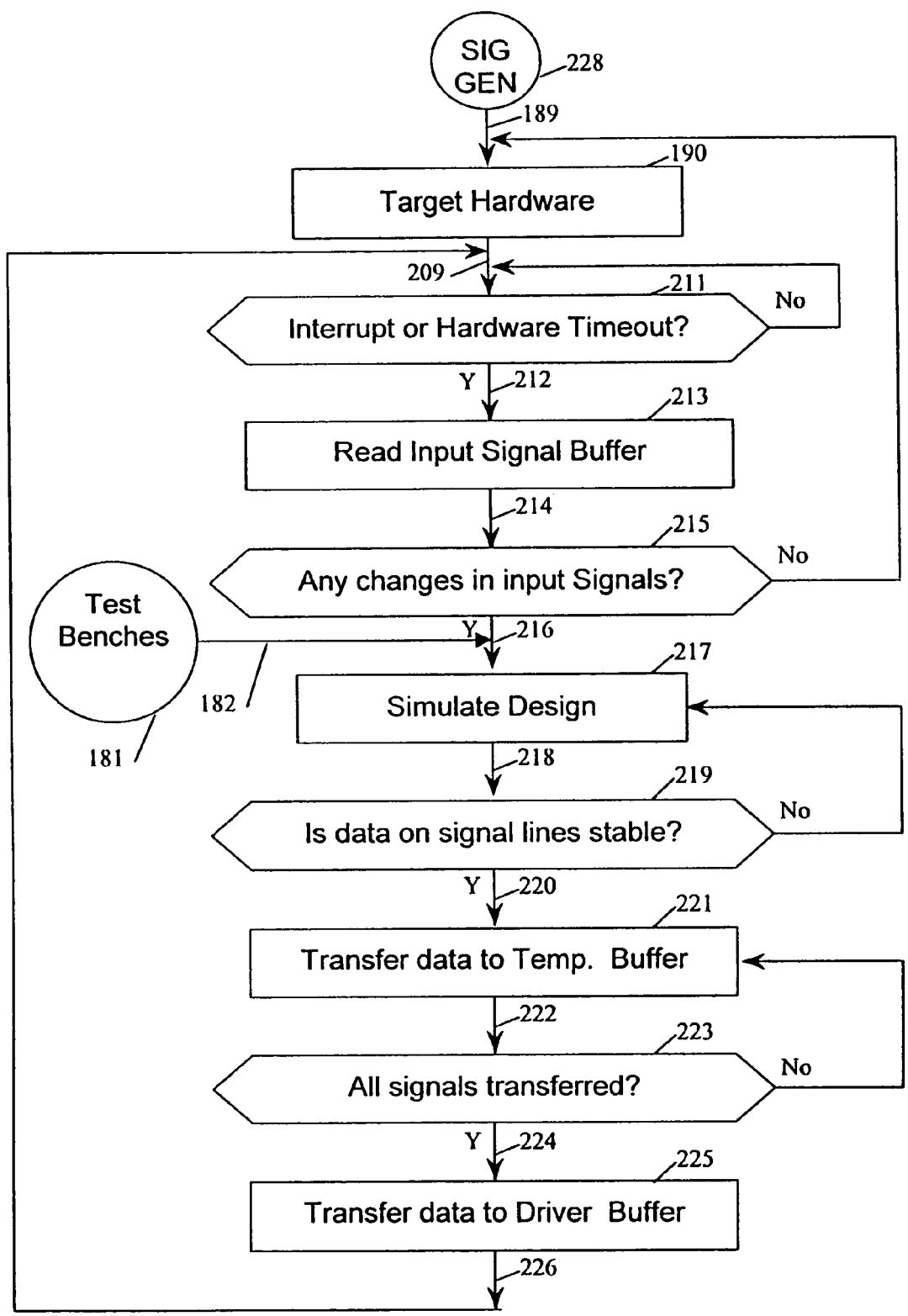
FIG. 14 is a flow diagram illustrating the subroutines for data transfer between a simulator and a hardware accelerator.

The closed loop operation of design blocks in simulator 4 and hardware accelerator 5 are described now in reference to FIGS. 13 and 14. FIG. 13 illustrates software subroutines residing in DVM 3 and associated with the setup of the closed loop operation between the simulator 4 and accelerator 5. Software subroutine "splitting design files" 231 operates under user control and divides ASIC design files 2 into a file to be simulated by the software simulator and another one that includes design blocks for execution in hardware. Subroutine "splitting design files" 231 provides the selected for simulation files, called "selected simulation" file, into database "selected for simulation" 233, residing preferably in RAM 171, via signal line 232. Subroutine "splitting design files" 231 saves, via signal line 234, chosen for hardware implementation design files into selected hardware execution file database 235, residing preferably in RAM 171. The information in selected simulation file database 233 is provided to simulator via signal line 7. The information in selected hardware execution file database 235 is processed further by DVM 3 subroutines listed in FIG. 2.

Subroutine 237 analyzes information on signal line 236 that provides data on what is being placed in simulator 4 and what will be downloaded into hardware accelerator 5 and identifies which simulator 4 output signals will be driving hardware accelerator input signal lines. This information is stored via signal lines 238 in SHA database 239, being preferably in RAM 171 and being available to simulator 4 subroutines. Simulator 4 software subroutines will use this information for configuring data being sent for simulator 4 to "output signal temporary buffers" 196 and driver buffer 194.

Finding test points feeding data from hardware accelerator to simulator subroutine 241 identifies test points in simulator 4 that will be receiving input signals from hardware accelerator 5 output signal lines. This information is stored via signal lines 242 in HAS database 243, which is residing preferably in RAM 171. The information in HAS database 243 is used for feeding signal lines to "input signal buffer" 191 and for configuring signal arrangement in the buffer 191.

The closed loop arrangement of design blocks residing in simulator 4 and hardware accelerator 5 can be stimulated into activity either by signals appearing on signal line 191 of the target hardware (FIG. 12) or on signal lines 182 driven by "test benches" database 181. If the stimuli signal appears on input signal lines 189 to target hardware 190, then target hardware 190 emulates the new input conditions and produces output signals on signal line 209. If target hardware 190 includes a microprocessor, then an interrupt will be generated by interrupt or hardware timeout subroutine 211, which can be a hardware implementation, software implementation or combination of both. Similarly, if target hardware 190 has some timers or delay lines, interrupt or hardware timeout subroutine 211 will generate a signal on signal lines 212 when they terminate their operation. If the target hardware does not have processor, timers or delay lines, it is preferred that interrupt or hardware timeout subroutine 211 downloads into register 191 signals for controlling simulator 4 inputs, and generates a signal on signal lines 212 within one or a few hardware clock cycles upon receiving data on signal lines 190. Signals on signal lines 212 inform simulator 4 that it can read data from "input signal buffer" 191.

"Read input signal buffer" 213 is a software subroutine within simulator 4 for reading data from buffer 191 and saving this data at appropriate locations in RAM 171, being under simulator 4 control. Upon completion of this operation, it issues a signal on signal line 214. Responding to data on signal line 214, any changes in input signals subroutine 215 checks if the new input signal data differs from previous inputs to simulator 4. If there is a difference a simulation cycle will be performed. If there was no difference on input signal lines provided by buffer 191, simulator 4 does not perform any simulation and awaits another set of inputs from hardware device 228 that will feed new hardware signals on signal lines 189 into target hardware 190.

If simulator 4 performed a simulation cycle by simulate design subroutine 217, it will provide simulation data on signal lines 218 and is data on signal lines stable subroutine 219 will check for simulation completion. Upon completion of the simulation cycle, is data on signal lines stable subroutine 219 will issue an output that will control data transfer to temporary buffer 196. The data transfers should preferably be made in 32 or 64 bit words, compatible with computer 1 internal bus structure. All signals transferred subroutine 223 monitors words transferred to output signal temporary buffer 196 on signal lines 222 and when the last data word has been sent to the output signal temporary buffer 196, the all signals transferred subroutine 223 issues a command on signal line 224 to transfer data from temporary buffer 196 to output signal driver buffer 194 that directly controls the target hardware. Transfer data to driver buffer subroutine 225 generates a signal on signal line 203 that actually performs downloading of data from output signal temporary buffers 196 to output signal driver buffer 196.

If the arrangement of simulator 4 with hardware accelerator 5 is stimulated by test bench signals 181 provided on signal lines 182, then simulate design subroutine 217 will perform one design simulation cycle. Is data on signal lines stable subroutine 219 monitors signal lines 218 to determine when the simulation cycle is complete and issues a signal on signal line 220 when the simulation data is stable and ready to feed into target hardware 190. Thereafter, the cycle described above repeats itself.

This invention is not to be limited by the embodiment shown in the drawings and described in the description which is given by way of example and not of limitation, but only in accordance with the scope of the appended claims.

What is claimed is:

1. A system for accelerating ASIC design verification by eliminating clock skew and race conditions in a digital circuit design comprising:
  a computer;
  said computer having random access memory;
  digital circuit design files being stored in said random access memory;
  a design verification manager program for processing said digital circuit design files being stored in said memory, said design verification program including:
    a find clock sources subroutine for finding clock sources in said digital circuit design file,
    a find synchronous primitives in said digital circuit design file that are receiving clock signals from said clock sources found by said find clock sources subroutine,
    an inserting edge detector circuits subroutine for inserting edge detector circuits between said clock sources found and said synchronous primitives;
  whereby the verification of digital circuit designs is accelerated.

2. The system according to claim 1 wherein said design verification manager includes: a subroutine for finding and replacing synchronous primitives without a clock enable input with synchronous primitives having clock enable inputs.

3. The system according to claim 1 wherein said design verification manager includes a subroutine for analyzing connections between inputs to said synchronous primitives and outputs from said synchronous primitives and inserting a data buffer between said inputs to said synchronous primitives and outputs from said synchronous primitives.

4. A system according to claim 1 wherein said design verification manager includes a subroutine for finding falling-edge clocked primitives activated with a falling clock-edge and substitutes rising clock-edge primitives for said falling clock-edge primitives.

5. The system according to claim 1 wherein said design verification manager includes a subroutine for finding rising edge clocked primitives activated by a rising clock-edge and substitutes rising clock-edge primitives with falling clock-edge primitives.

6. A system for simulating digital circuit designs comprising:
  a computer;
  said computer including memory for storing design files;
  a design verification manager program for processing said design files stored in said memory;
  a simulator program for simulating design files or a selected part thereof stored in said memory;
  test bench files for stimulating operations of said simulator;
  said computer including a hardware accelerator;
  said design verification manager program including a subroutine for splitting a design file into a selected simulation file and a selected hardware execution file;
  said design verification manager program downloading said selected simulation file into said simulator and downloading said selected hardware execution file into said hardware accelerator;
  a subroutine in said design verification manager program for finding clock sources in said selected hardware execution file;
  a subroutine for finding synchronous primitives with clock-driven inputs in said circuit design file that are receiving clock signals from said clock sources;
  a software subroutine for inserting edge detector circuits between said clock sources and said synchronous primitives;
  said find finding clock sources subroutine, said finding synchronous primitives subroutine, and said inserting edge detector circuit subroutine operating on said selected hardware execution file by said design verification manager;
  whereby digital circuit designs verification is accelerated.

7. A system for simulating digital circuits according to claim 6 wherein
  said hardware accelerator includes:
    target hardware,
    a temporary buffer,
    a driver buffer,
  said simulator includes:
    a subroutine for performing functional simulation of said selected simulation file,
    a subroutine for detecting the end of simulation of said selected
  simulation file by said subroutine for performing
  functional simulation,
  said hardware accelerator including:
    a subroutine for transferring data to said temporary buffer,
    a subroutine for detecting the end of data transfer to said temporary buffer,
    a subroutine responding to said subroutine for detecting the end of data transfer to said temporary buffer and causing data transfer from said temporary buffer to said driver buffer, and outputs of said driver buffer being applied approximately at the same time to said target hardware input signal lines.

8. A system for simulating digital circuits according to claim 7 wherein
said hardware accelerator includes:
an input signal buffer,
said simulator includes:
a read input signal buffer subroutine for reading data from said hardware accelerator into said simulator,
said input signal buffer storing inputs from logic elements within said target hardware,
a hardware timeout subroutine,
said hardware timeout subroutine being responsive to said subroutine for responding to the detection of an end of data transfer of and causing a read data from said input signal buffer to said simulator wherein reading of said data takes place at a time that is determined preferably in terms of a simulator internal clock, said time being in duration from one to one hundreth of said simulator internal clocks.

9. A system for simulating digital circuits according to claim 7, wherein
said hardware accelerator includes a read detector circuit, an input signal buffer,
said simulator includes:
an interrupt subroutine,
a read input signal buffer subroutine for reading data from input signal buffer into said simulator;
said input signal buffer storing output from logic elements within said target hardware;
said read detector circuit being responsive to signal processing within said target hardware and producing an interrupt signal upon completion of said signal processing; and
said interrupt subroutine being responsive to said interrupt signal and causing reading of data from said input signal buffer to said simulator wherein the reading of said data is preferably instantaneous.

\* \* \* \* \*